United States Patent
Yang et al.

(10) Patent No.: US 9,419,126 B2
(45) Date of Patent: Aug. 16, 2016

(54) INTEGRATED CIRCUITS AND METHODS FOR FABRICATING INTEGRATED CIRCUITS WITH ACTIVE AREA PROTECTION

(71) Applicant: GLOBALFOUNDRIES, Inc., Grand Cayman (KY)

(72) Inventors: Xiaodong Yang, Hopewell Junction, NY (US); Jin Ping Liu, Hopewell Junction, NY (US); Yanxiang Liu, Wappingers Falls, NY (US); Xusheng Wu, Hopewell Junction, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 22 days.

(21) Appl. No.: 13/835,944

(22) Filed: Mar. 15, 2013

(65) Prior Publication Data

US 2014/0264613 A1    Sep. 18, 2014

(51) Int. Cl.
*H01L 29/78*     (2006.01)
*H01L 21/8238*   (2006.01)
*H01L 29/66*     (2006.01)
*H01L 29/165*    (2006.01)

(52) U.S. Cl.
CPC ........ *H01L 29/78* (2013.01); *H01L 21/823807* (2013.01); *H01L 21/823814* (2013.01); *H01L 21/823878* (2013.01); *H01L 29/165* (2013.01); *H01L 29/66636* (2013.01); *H01L 29/7848* (2013.01)

(58) Field of Classification Search
CPC .............. H01L 21/823412; H01L 21/823418; H01L 21/823807; H01L 21/823814; H01L 21/84; H01L 29/1083; H01L 29/66628; H01L 29/66636; H01L 29/7842; H01L 29/6653; H01L 29/165; H01L 29/665; H01L 29/6656; H01L 21/265; H01L 21/83814
USPC .................... 257/347, 401; 438/300
See application file for complete search history.

(56) References Cited

U.S. PATENT DOCUMENTS

| 7,670,934 | B1 * | 3/2010 | Pal et al. ................. 438/481 |
| 2006/0189061 | A1 * | 8/2006 | Amos et al. ............... 438/199 |
| 2007/0057324 | A1 * | 3/2007 | Tews ............... H01L 29/6653 257/347 |
| 2007/0190730 | A1 * | 8/2007 | Huang et al. ............. 438/299 |
| 2008/0179627 | A1 * | 7/2008 | Ieong et al. ............. 257/190 |
| 2009/0068810 | A1 * | 3/2009 | Tsai ............... H01L 29/6656 438/300 |
| 2009/0242995 | A1 * | 10/2009 | Suzuki et al. ............ 257/368 |
| 2009/0294894 | A1 * | 12/2009 | Dyer ..................... 257/506 |
| 2011/0312145 | A1 * | 12/2011 | Tsai et al. ............. 438/300 |

OTHER PUBLICATIONS

"Si/SiGe Epitaxy and Selective Etch Applications for Advanced Thin-Films MOSFET Structures," N. Loubet et al., ECS—The Electrochemical Society, 2008, pp. 1-9.

* cited by examiner

*Primary Examiner* — David Vu
*Assistant Examiner* — Mouloucoulaye Inoussa
(74) *Attorney, Agent, or Firm* — Ingrassia Fisher & Lorenz, P.C.

(57) ABSTRACT

Integrated circuits and methods for fabricating integrated circuits are provided. In an embodiment, a semiconductor substrate includes a shallow trench isolation structure disposed therein. A gate electrode structure overlies semiconductor material of the semiconductor substrate. A first sidewall spacer is formed adjacent to the gate electrode structure, with a first surface of the shallow trench isolation structure exposed and spaced from the first sidewall spacer by a region of the semiconductor material. The first surface of the shallow trench isolation structure is masked with an isolation structure mask. The region of the semiconductor material is free from the isolation structure mask. A recess is etched in the region of the semiconductor material, with the isolation structure mask in place. A semiconductor material is epitaxially grown within the recess to form an epitaxially-grown semiconductor region adjacent to the gate electrode structure.

11 Claims, 3 Drawing Sheets

INTEGRATED CIRCUITS AND METHODS FOR FABRICATING INTEGRATED CIRCUITS WITH ACTIVE AREA PROTECTION

TECHNICAL FIELD

The technical field generally relates to integrated circuits and methods for fabricating integrated circuits, and more particularly relates to integrated circuits and methods for fabricating integrated circuits with prevention of shorting between source and drain active regions, and between active areas and electrical contacts.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode structure that overlies the channel. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, increasing transistor density and thus decreasing transistor size has traditionally been a high priority in the semiconductor manufacturing industry. Transistor performance, however, must be maintained even as the transistor size decreases.

As advanced metal-oxide-semiconductor (MOS) technology continues to scale and move into the deep-sub-micron geometry dimensions, the optimization of source/drain regions has become complex. Conventional techniques that are employed to form the source/drain regions can negatively impact the active areas and the gate electrode structures. In particular, epitaxially-grown semiconductor regions are generally formed adjacent to the channels beneath the gate electrode structures, in recesses that are formed between a shallow trench isolation structure and the gate electrode structures. For example, epitaxially-grown silicon germanium applies a compressive longitudinal stress to the channel, and such stress has been found to increase mobility of electrons in the channel of a PMOS transistor. Conversely, epitaxially-grown carbon-doped silicon applies a tensile longitudinal stress to the channel, and such stress has been found to increase mobility of electrons in the channel of an NMOS transistor. Source/drain regions are formed in the epitaxially-grown semiconductor regions after formation thereof. However, many semiconductor materials that are generally employed to form the epitaxially-grown semiconductor regions propagate through both lateral and vertical growth. For example, epitaxially-grown silicon germanium having from 30 to 40 weight % germanium, based on the total weight of the epitaxially-grown silicon germanium, is generally employed due to excellent controllability and quality of the resulting epitaxially-grown semiconductor regions, although such epitaxially-grown silicon germanium propagates through both lateral and vertical growth. Because the shallow trench isolations structures generally have a surface on an equal or recessed plane relative to a final surface of the epitaxially-grown semiconductor regions, facet overgrowth may occur over an edge of the shallow trench isolation structure during formation of the epitaxially-grown semiconductor regions. The facet overgrowth may cause undesirable shorting between subsequently-formed electrical interconnects and the source/drain regions. While epitaxially-grown silicon germanium that includes higher amounts of germanium, such as at least 50 weight % germanium, exhibits less lateral propagation than epitaxially-grown silicon germanium having from 30 to 40 weight % germanium, epitaxially-grown silicon germanium having at least 50 weight % germanium exhibits inferior quality of the resulting epitaxially-grown semiconductor regions and is more difficult to control than epitaxially-grown silicon germanium having from 30 to 40 weight % germanium.

Accordingly, it is desirable to provide methods of forming integrated circuits with minimized facet overgrowth of epitaxially-grown semiconductor regions over the shallow trench isolation structures. It is also desirable to minimize the facet overgrowth while maintaining the quality of the resulting epitaxially-grown semiconductor regions and controllability of epitaxially-grown semiconductor region formation. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits and methods for fabricating integrated circuits are provided herein. In an embodiment of a method for fabricating an integrated circuit, a semiconductor substrate is provided that includes a shallow trench isolation structure disposed in the semiconductor substrate. A gate electrode structure overlies semiconductor material of the semiconductor substrate. A first sidewall spacer is formed adjacent to the gate electrode structure, with a first surface of the shallow trench isolation structure exposed and spaced from the first sidewall spacer by a region of the semiconductor material. The first surface of the shallow trench isolation structure is masked with an isolation structure mask. The region of the semiconductor material that is disposed between the first sidewall spacer and the shallow trench isolation structure is free from the isolation structure mask. A recess is etched in the region of the semiconductor material that is disposed between the first sidewall spacer and the shallow trench isolation structure, with the isolation structure mask in place. A semiconductor material is epitaxially grown within the recess after masking the first surface of the shallow trench isolation structure with the isolation structure mask to form an epitaxially-grown semiconductor region adjacent to the gate electrode structure.

In another embodiment of a method for fabricating an integrated circuit, a semiconductor substrate is provided that includes a shallow trench isolation structure disposed in the semiconductor substrate. A gate electrode structure overlies semiconductor material of the semiconductor substrate. A first sidewall spacer is formed adjacent to the gate electrode structure, with a first surface of the shallow trench isolation structure exposed and spaced from the first sidewall spacer by a region of the semiconductor material. A self-aligned dummy structure is formed over the region of the semiconductor material between the first sidewall spacer and the shallow trench isolation structure. An oxide mask layer is formed over the gate electrode structure, the first sidewall spacer, the self-aligned dummy structure, and the first surface of the shallow trench isolation structure. The oxide mask layer is etched to a depth of the self-aligned dummy structure to expose a dummy structure surface. The self-aligned dummy structure is selectively removed to expose a semiconductor surface in the region of the semiconductor material between the first sidewall spacer and the shallow trench isolation structure. A portion of the oxide mask layer remains over the shallow trench isolation structure as an isolation structure mask after selectively removing the self-aligned dummy structure. A recess is etched in the region of the semiconductor material that is disposed between the first sidewall spacer and the shallow trench isolation structure, with the isolation structure mask in place. A semiconductor material is epitaxially grown within the recess to form an epitaxially-grown semiconductor region adjacent to the gate electrode structure.

In another embodiment, an integrated circuit includes a semiconductor substrate that includes a shallow trench isolation structure that is disposed in the semiconductor substrate. A gate electrode structure overlies semiconductor material of the semiconductor substrate. A first sidewall spacer is disposed adjacent to the gate electrode structure. An epitaxially-grown semiconductor region is disposed in the semiconductor substrate between the first sidewall spacer and the shallow trench isolation structure. An isolation structure mask overlies the shallow trench isolation structure. An interlayer dielectric layer overlies the gate electrode structure, the first sidewall spacer, and the isolation structure mask.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Methods for fabricating integrated circuits are provided herein. In particular, the integrated circuits formed in accordance with the methods that are described herein include a semiconductor substrate, a source region and a drain region disposed in the semiconductor substrate, a channel region defined between the source region and the drain region in the semiconductor substrate, a gate dielectric layer overlying the channel region, and a gate electrode structure overlying the gate dielectric layer. A first sidewall spacer is disposed adjacent to the gate electrode structure. A shallow trench isolation (STI) structure is disposed in the semiconductor substrate, and an epitaxially-grown semiconductor region is disposed in the semiconductor substrate between the first sidewall spacer and the STI structure. An isolation structure mask overlies the STI structure, and an interlayer dielectric layer overlies the gate electrode structure, the first sidewall spacer, and the isolation structure mask. The isolation structure mask is formed prior to formation of the epitaxially-grown semiconductor region and has a mask surface that may be raised in relation to the epitaxially-grown semiconductor region. In this regard, the isolation structure mask inhibits facet overgrowth of the epitaxially-grown semiconductor region over the STI structure, even when semiconductor materials are employed to form the epitaxially-grown semiconductor regions that exhibit significant lateral growth. Further, minimized facet overgrowth is realized while employing semiconductor materials that maximize the quality of the resulting epitaxially-grown semiconductor regions and controllability of epitaxially-grown semiconductor region formation.

Figure 1:
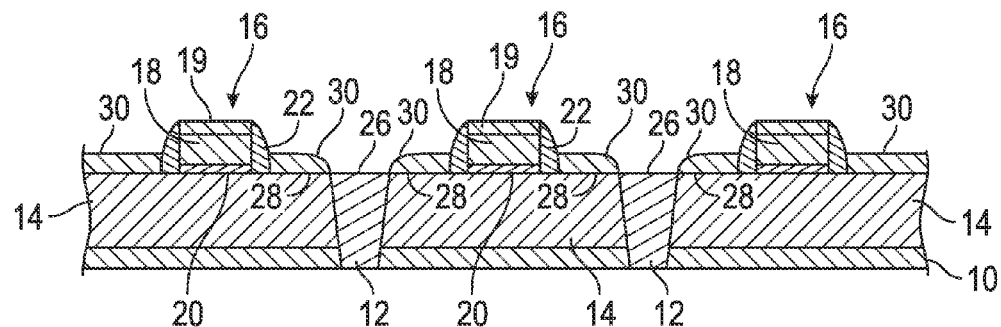
FIGS. 1-8 illustrate, in cross section, a method for fabricating a portion of an integrated circuit in accordance with an exemplary embodiment.

An exemplary method of forming an integrated circuit 54 will now be described with reference to FIGS. 1-7, with a portion of an integrated circuit 54 formed in accordance with the exemplary method shown in FIG. 7. Referring to FIG. 1, a semiconductor substrate 10 including a first semiconductor material is provided. The first semiconductor material may be any semiconductor material that is known for industrial use in electronic devices. Examples of the first semiconductor material include, but are not limited to, those chosen from silicon, silicon germanium (SiGe), germanium (Ge), gallium arsenide (GaAs), or indium phosphide (InP). For example, in an embodiment, the first semiconductor material is silicon, and the silicon is present in an amount of from about 95 to about 100 mol %, such as from about 99 to about 100 mol %, based upon the total amount of atoms in the semiconductor substrate 10. The silicon may be substantially pure, i.e., dopants and/or impurities are present in amounts of less than or equal to 1 mol % based upon the total amount of atoms in the semiconductor substrate 10 and are desirably absent from the semiconductor substrate 10.

Referring again to FIG. 1, the semiconductor substrate 10 is provided including a STI structure 12 disposed therein. In accordance with an embodiment, the STI structure 12 is formed in the semiconductor substrate 10, which may include wells 14 that are formed through conventional fabrication techniques. In the embodiment shown in FIG. 1, two STI structures 12 are formed, although it is to be appreciated that numerous STI structures 12 may be formed in the integrated circuit. The wells 14 have a dopant concentration, or a concentration of conductivity determining ions, and the conductivity determining ions may be a P-type or N-type conductivity determining ions, depending upon whether a PMOS transistor or NMOS transistor is to be formed. Each well 14 contains opposite conductivity determining ions from a source region and a drain region of transistors that are to be formed therein. For example, when the source region and drain region for a transistor include P-type conductivity determining ions, the well 14 includes N-type conductivity determining ions, and vice versa. Typical N-type conductivity determining ions include, but are not limited to, phosphorus, arsenic, antimony, and combinations thereof. Typical P-type conductivity determining ions include, but are not limited to, boron, aluminum, gallium, indium, and combinations thereof.

In an embodiment and as also shown in FIG. 1, the semiconductor substrate 10 is further provided including a gate electrode structure 16. In accordance with an embodiment, the gate electrode structure 16 is formed overlying the semiconductor substrate 10, with FIG. 1 showing a plurality of gate electrode structures 16 overlying the semiconductor substrate 10. In particular, the gate electrode structures 16 overlie semiconductor material of the semiconductor substrate 10, i.e., the gate electrode structures 16 do not overlie the STI structures 12. As used herein, the term "overlying" is used to encompass both "over" and "on". In this regard, one feature that overlies a second feature may include intervening features, such as a layer, interposed between the one feature and the second feature within the scope of the term "overlying". Alternatively, the one feature may be formed directly on a surface of the second feature within the scope of the term "overlying". For illustrative purposes, FIGS. 1-7 show only one type of gate electrode structure 16, i.e., for either a P-type transistor or an N-type transistor, although it is to be appreciated that the integrated circuits described herein may include a plurality of P-type gate electrode structures and a plurality of N-type gate electrode structures. In this regard, FIGS. 1-7 are merely provided to illustrate general principles described herein in accordance with an embodiment of a method of forming integrated circuits and are not intended to be limiting. As shown in FIG. 1, each of the gate electrode structures 16 includes a gate electrode 18 that overlies a gate dielectric layer 20. The gate electrode structures 16 may be part of a metal-oxide-semiconductor (MOS) transistor device that is formed on the semiconductor substrate 10. Although the term 'MOS transistor device' properly refers to a device having a metal gate electrode and an oxide gate insulator, that term is used herein to refer to any semiconductor device that includes a conductive gate electrode (whether metal or other conductive material) that is positioned overlying a gate insulator (whether oxide or other insulator) which, in turn, is positioned overlying the semiconductor substrate 10. The gate electrode structures 16 may be formed through conventional techniques. The gate dielectric layer 20 may include an insulator material such as, but not limited to, silicon dioxide, silicon oxide, silicon nitride, or the like. The gate electrode 18 may be formed from conventional materials including copper, silver, and doped or undoped polycrystalline silicon.

Referring to FIG. 1, a nitride cap 19 is formed overlying the gate electrode 18 to provide protection to the gate electrode 18 during fabrication of the integrated circuit. The nitride cap 19 may be formed from any nitride such as, for example, silicon nitride. A first sidewall spacer 22 is then formed adjacent to the gate electrode structure 16. More specifically, as shown in FIG. 1, first sidewall spacers 22 are formed adjacent to each gate electrode structure 16, on opposite sides thereof, to insulate the gate electrode 18 and to align formation of an epitaxially-grown semiconductor region the semiconductor substrate 10, as described in further detail below. In this regard, the first sidewall spacer 22 is formed prior to forming the epitaxially-grown semiconductor region the semiconductor substrate 10. After forming the first sidewall spacer 22, a first surface 26 of the STI structure 12 is exposed and spaced from the first sidewall spacer 22 by a region 28 of the semiconductor material in the semiconductor substrate 10. The first sidewall spacer 22 is formed from a nitride, which may have the same nominal composition as the nitride cap 19. It is to be appreciated that designation of the first sidewall spacer 22 as a "first" sidewall spacer is not to be interpreted as limiting or as requiring any particular order, and it is to be appreciated that other sidewall spacers may be formed prior to or after formation of the first sidewall spacer 22 in accordance with conventional integrated circuit fabrication techniques.

After formation of the first sidewall spacers, the first surface of the STI structure is masked with an isolation structure mask, with the region of the semiconductor material that is disposed between the first sidewall spacer and the STI structure being free from the isolation structure mask. In accordance with an embodiment and as shown in FIG. 1, a dummy structure 30 is formed over the region 28 of the semiconductor material, between the first sidewall spacer 22 and the STI structure 12, to control a configuration of the isolation structure mask. In this regard, the dummy structure 30 is formed prior to masking the first surface 26 of the STI structure 12. The dummy structure 30 overlies the region 28 of the semiconductor material and is generally not embedded therein. In an embodiment, the dummy structure 30 is only formed over the region 28 of the semiconductor material between the first sidewall spacer 22 and the STI structure 12 to enable subsequent formation of the isolation structure mask in a self-aligned manner only over the first surface 26 of the STI structure 12, as described in further detail below. In an embodiment, to isolate formation of the dummy structure 30 to the region 28 of the semiconductor material between the first sidewall spacer 22 and the STI structure 12, the dummy structure 30 may be a self-aligned dummy structure 30 that is formed over the region 28 of the semiconductor material between the first sidewall spacer 22 and the STI structure 12. The self-aligned dummy structure 30 may be formed by epitaxially growing a crystalline material over the region 28 of the semiconductor material between the first sidewall spacer 22 and the STI structure 12. Examples of suitable crystalline materials for the self-aligned dummy structure 30 include, but are not limited to, those chosen from silicon germanium, silicon carbide, or silicon germanium carbide. In an embodiment, the self-aligned dummy structure 30 includes crystalline material that exhibits less lateral propagation than materials that are generally used to form epitaxially-grown semiconductor regions that are embedded in the semiconductor substrate 10, thereby forming the self-aligned dummy structure 30 with substantially vertical sidewalls with minimized facet overgrowth over the first surface 26 of the STI structure 12. Because the dummy structure 30 is absent from the final integrated circuits, chemical makeup and material properties of the dummy structure 30 are inconsequential to performance of the final integrated circuits. Thus, in an embodiment, the self-aligned dummy structure 30 includes epitaxially-grown silicon germanium that has at least 50 weight % germanium, such as from about 50 to about 90 weight % germanium, based on the total weight of the crystalline material.

Figure 2:
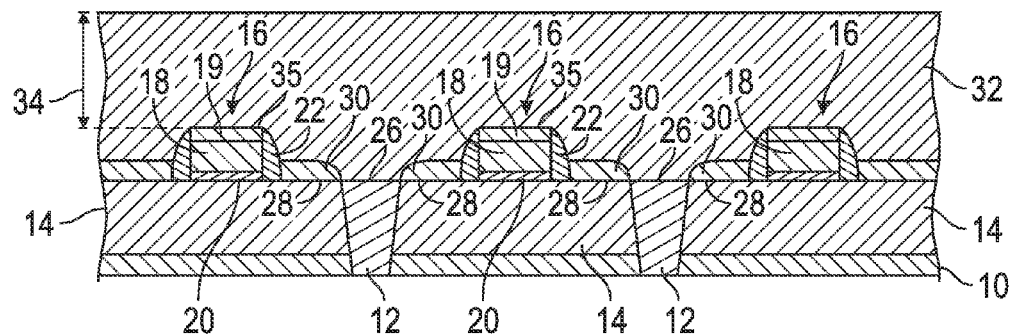

In an embodiment, after forming the dummy structure 30 and now referring to FIG. 2, a mask layer 32 is formed over the gate electrode structure 16, the first sidewall spacer 22, the dummy structure 30, and the first surface 26 of the STI structure 12. In an embodiment, the mask layer 32 is an oxide mask layer 32, such as silicon dioxide. The oxide mask layer 32 can be selectively etched using an oxide etchant, as described in further detail below, without impacting the gate electrode structure 16 due to the presence of the nitride cap 19 over the gate electrode structure 16. By "selectively etched", it is meant that one material has a higher etch rate in a particular etchant than another material. It is to be appreciated that in embodiments, the mask layer 32 may be formed from materials other than oxides provided that the mask layer 32 may be selectively etched without completely removing the nitride cap 19 from over the gate electrode structure 16. Further, other materials for the mask layer 32 can also be selectively etched from the dummy structure 30.

Figure 3:
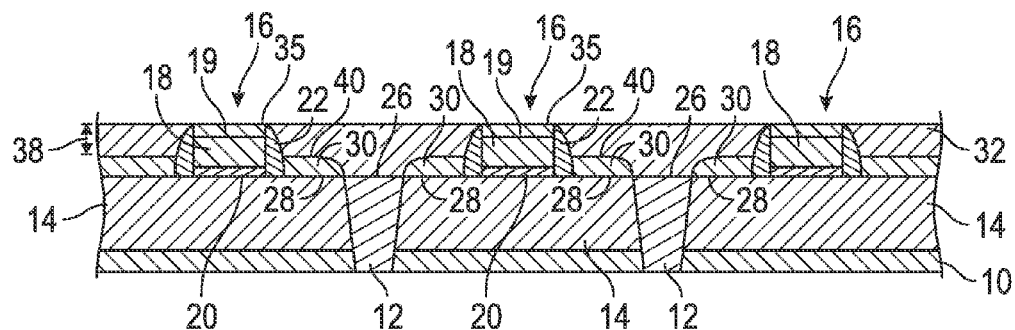
Figure 4:
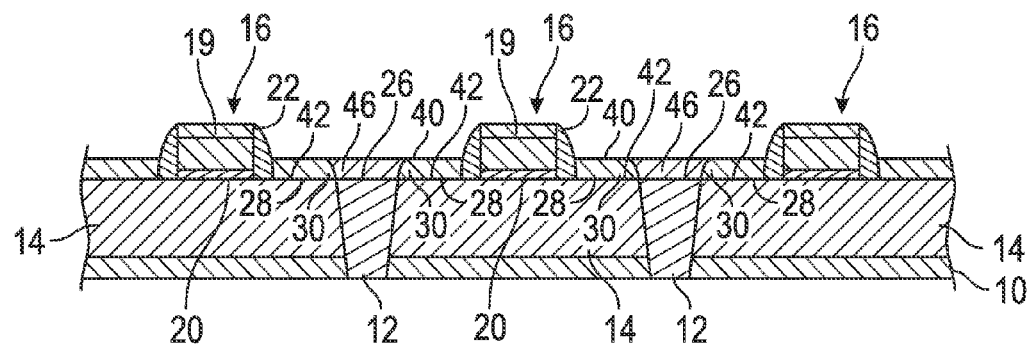

In an embodiment and as shown in FIGS. 2 and 3, after forming the mask layer 32, the mask layer 32 is planarized to a first depth 34 of the gate electrode structure 16, as shown in FIG. 2, thereby resulting in the configuration of the mask layer 32 shown in FIG. 3. In particular, the mask layer 32 is planarized to the first depth 34 of a surface 35 of the nitride cap 19. The mask layer 32 may be planarized through conventional techniques, such as chemical mechanical planarization (CMP). In the embodiment shown in FIGS. 3 and 4, after planarizing the mask layer 32 to the first depth 34 of the surface 35 of the nitride cap 19, the mask layer 32 is then etched to a second depth 38 of the dummy structure 30 to expose a dummy structure surface 40. In an embodiment, the mask layer 32 is the oxide mask layer 32 and is anisotropically etched with an oxide etchant. An example of a suitable oxide etchant includes, but is not limited to, hydrofluoric acid. Although not shown, it is to be appreciated that in alternative embodiments, the mask layer 32 may be etched to the second depth 38 of the dummy structure 30 without first planarizing the mask layer 32, although first planarizing the mask layer 32 to the first depth 34 is generally faster and more efficient than only etching the mask layer 32 to second depth 38 of the dummy structure 30.

Figure 5:
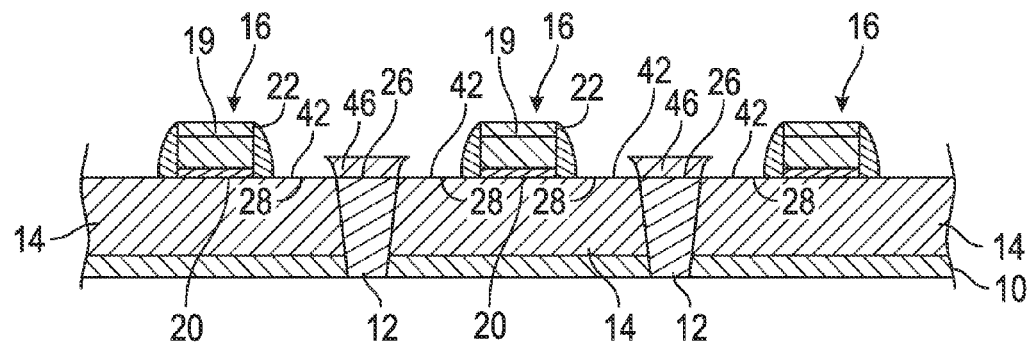
Figure 6:
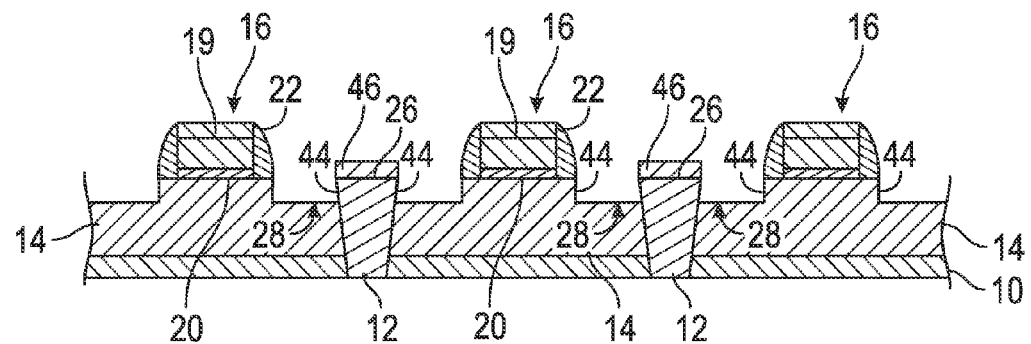

In an embodiment, after etching the mask layer 32 to the second depth 38 of the dummy structure 30, the dummy structure 30 is selectively removed to expose a semiconductor surface 42 in the region 28 of the semiconductor material between the first sidewall spacer 22 and the STI structure 12 as shown in FIG. 5, followed by etching a recess 44 in the region 28 of the semiconductor material that is disposed between the first sidewall spacer 22 and the STI structure 12 as shown in FIG. 6. The dummy structure 30 is generally selectively removed through etching with an appropriate etchant for the type of material used for the dummy structure 30, and the recess 44 may be etched in accordance with conventional techniques for forming epitaxially-grown semiconductor regions in semiconductor substrates. For example, when the dummy structure 30 includes silicon germanium, a suitable silicon germanium etchant may be used, such as but not limited to ammonium hydroxide. A separate etchant may be used to form the recess 44, depending upon the particular semiconductor material that is present in the wells 14. For example, in an embodiment, the recess 44 may be anisotropically etched with a plasma etching technique using a Cl or HBr/O$_2$ chemistry. Due to differences in etch rates between materials used for the mask layer 32 and the dummy structure 30, a portion of the mask layer 32 remains over the STI structure 12 as an isolation structure mask 46 after selectively removing the dummy structure 30. Further, due to the formation and selective removal of the dummy structure 30, the first surface 26 of the STI structure 12 is masked with the resulting isolation structure mask 46 and the region 28 of the semiconductor material that is disposed between the first sidewall spacer 22 and the STI structure 12 is free from the isolation structure mask 46, as shown in FIG. 5.

Figure 7:
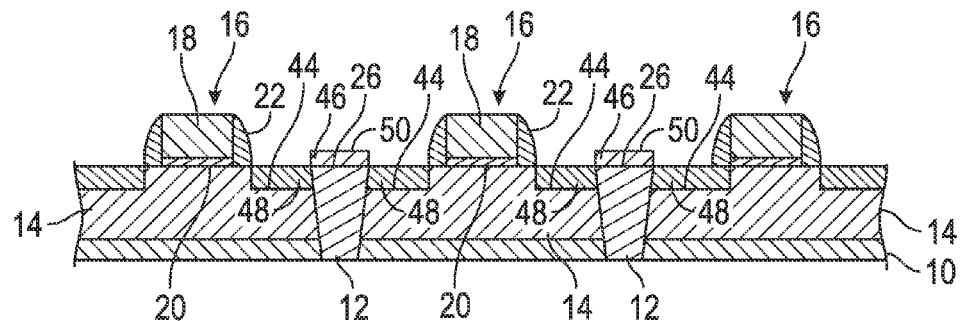

In an embodiment and as shown in FIG. 7, an epitaxially-grown semiconductor region 48 is formed in the recess 44 with the isolation structure mask 46 in place over the first surface 26 of the STI structure 12. In particular, a semiconductor material is epitaxially grown within the recess 44 on the exposed crystal lattice of the wells 14 in the semiconductor substrate 10 to form the epitaxially-grown semiconductor region 48 adjacent to the gate electrode structure 16. The epitaxially-grown semiconductor region 48 only forms on exposed areas of semiconductor material of the semiconductor substrate 10, and little to no epitaxially-grown semiconductor material generally forms on the isolation structure mask 46 or the nitride cap 19. Formation of the epitaxially-grown semiconductor region 48 occurs without interference from the isolation structure mask 46 due to the self-aligned configuration of the isolation structure mask 46 over the first surface 26 of the STI structure 12. The isolation structure mask 46 effectively prevents facet overgrowth over the first surface 26 of the STI structure 12 during formation of an epitaxially-grown semiconductor region 48. In particular, the isolation structure mask 46 generally has a mask surface 50 that is raised in relation to the epitaxially-grown semiconductor region 48 such that lateral growth of the epitaxially-grown semiconductor region 48 is blocked by the isolation structure mask 46. Thus, conventional materials that are used to form epitaxially-grown semiconductor regions may be used without risking defects that are attributable to facet overgrowth. It is to be appreciated that the method described herein is not limited to any particular materials for the epitaxially-grown semiconductor region 48 and that any conventional material may be employed to form the epitaxially-grown semiconductor region 48 between the first sidewall spacer 22 and the STI structure 12. For example, in an embodiment and for PMOS transistors, silicon germanium that has from about 30 to about 40 weight % germanium based on the total weight of the epitaxially-grown semiconductor region 48 may be epitaxially grown in the recess 44 to form the epitaxially-grown semiconductor region 48. Alternatively, in an embodiment and for NMOS transistors, carbon-doped silicon that has from about 1 to about 3 weight % carbon based on the total weight of the epitaxially-grown semiconductor region 48 may be epitaxially grown in the recess 44 to form the epitaxially-grown semiconductor region 48.

Figure 8:
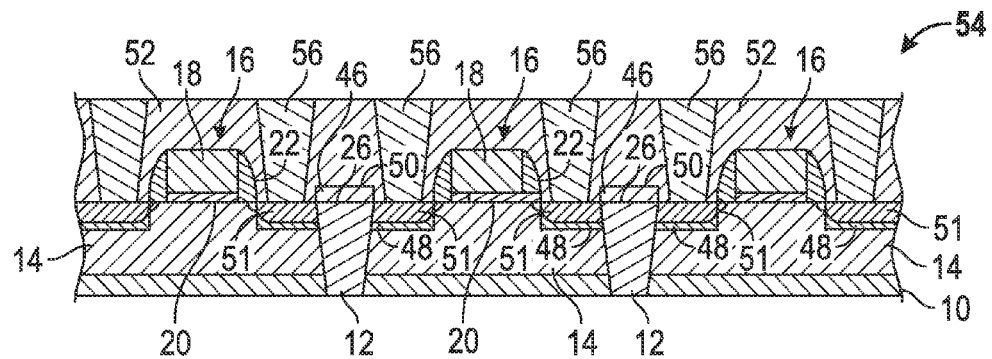

After forming the epitaxially-grown semiconductor region 48, the integrated circuit may be completed in accordance with conventional techniques. For example, in an embodiment and as shown in FIG. 7, the nitride cap 19 is removed after epitaxially growing the semiconductor material within the recess 44. For example, the nitride cap 19 may be removed through anisotropic etching with a suitable nitride etchant such as, but not limited to, phosphoric acid. In an embodiment and as shown in FIG. 8, the isolation structure mask 46 remains overlying the STI structure 12 in the final integrated circuit 54. For example, source/drain regions 51 may be formed in the epitaxially-grown semiconductor region 48 in accordance with conventional integrated circuit fabrication techniques, and an interlayer dielectric layer 52 may be formed overlying the gate electrode structure 16, the first sidewall spacer 22, and the isolation structure mask 46, as well as over the source/drain regions 51. In other embodiments although not shown, the isolation structure mask 46 may be removed after forming the epitaxially-grown semiconductor regions. Electrical interconnects 56 may then be formed to establish an electrical connection with the source/drain regions 51 in accordance with conventional integrated circuit fabrication techniques to form the exemplary integrated circuit 54 as shown in FIG. 8.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an integrated circuit comprising:
   providing a semiconductor substrate including a shallow trench isolation structure disposed therein and a gate electrode structure overlying semiconductor material of the semiconductor substrate;
   forming a first sidewall spacer adjacent to the gate electrode structure, wherein a first surface of the shallow trench isolation structure is exposed and spaced from the first sidewall spacer by a region of the semiconductor material;
   epitaxially growing a crystalline material over the region of the semiconductor material between the first sidewall spacer and the shallow trench isolation structure to form a self-aligned dummy structure, wherein the dummy structure is not embedded in the region of semiconductor material, and wherein the shallow trench isolation structure remains free of the dummy material after epitaxially growing the crystalline material over the region of the semiconductor material between the first sidewall spacer and the shallow trench isolation structure, forming an oxide mask layer in a self-aligned manner on the exposed first surface of the shallow trench isolation structure after epitaxially growing the crystalline material over the region of the semiconductor material between the first sidewall spacer and the shallow trench isolation structure, wherein the region of the semiconductor material disposed between the first sidewall spacer and the shallow trench isolation structure is free from the isolation structure mask, and wherein the isolation structure mask is only disposed on the shallow trench isolation structure;

etching a recess in the region of the semiconductor material disposed between the first sidewall spacer and the shallow trench isolation structure with the isolation structure mask in place; and epitaxially growing a semiconductor material within the recess after masking the first surface of the shallow trench isolation structure with the isolation structure mask to form an epitaxially-grown semiconductor region adjacent to the gate electrode structure;

wherein the isolation structure mask is formed with a mask surface of the isolation structure mask raised in relation to the epitaxially-grown semiconductor region disposed in the semiconductor substrate.

2. The method of claim 1, wherein epitaxially growing the crystalline material comprises epitaxially growing crystalline material chosen from silicon germanium, silicon carbide, or silicon germanium carbide over the region of the semiconductor material between the first sidewall spacer and the shallow trench isolation structure.

3. The method of claim 1, wherein epitaxially growing the crystalline material comprises epitaxially growing silicon germanium having at least 50 weight % germanium based on the total weight of the crystalline material.

4. The method of claim 3, wherein epitaxially growing the semiconductor material within the recess after masking the first surface of the shallow trench isolation structure comprises epitaxially growing silicon germanium having from about 30 to about 40 weight % germanium based on the total weight of the epitaxially-grown semiconductor region.

5. The method of claim 1, wherein masking the first surface of the shallow trench isolation structure comprises forming an oxide mask layer over the gate electrode structure, the first sidewall spacer, the dummy structure, and the first surface of the shallow trench isolation structure.

6. The method of claim 5, wherein masking the first surface of the shallow trench isolation structure further comprises etching the oxide mask layer to a second depth of the dummy structure to expose a dummy structure surface.

7. The method of claim 6, wherein a nitride cap overlies the gate electrode structure, and wherein masking the first surface of the shallow trench isolation structure further comprises planarizing the oxide mask layer to a first depth of a surface of the nitride cap prior to etching the oxide mask layer to the second depth of the dummy structure.

8. The method of claim 7, further comprising removing the nitride cap after epitaxially growing the semiconductor material within the recess.

9. The method of claim 6, wherein masking the first surface of the shallow trench isolation structure further comprises selectively removing the dummy structure to expose a semiconductor surface in the region of the semiconductor material between the first sidewall spacer and the shallow trench isolation structure.

10. A method for fabricating an integrated circuit comprising:
providing a semiconductor substrate including a shallow trench isolation structure disposed therein and a gate electrode structure overlying semiconductor material of the semiconductor substrate;
forming a first sidewall spacer adjacent to the gate electrode structure, wherein a first surface of the shallow trench isolation structure is exposed and spaced from the first sidewall spacer by a region of the semiconductor material;
epitaxially growing a crystalline material over the region of the semiconductor material between the first sidewall spacer and the shallow trench isolation structure to form a self-aligned dummy structure over the region of the semiconductor material between the first sidewall spacer and the shallow trench isolation structure, wherein the self-aligned dummy structure is not embedded in the region of semiconductor material, and wherein the shallow trench isolation structure remains free of the dummy material after epitaxially growing the crystalline material over the region of the semiconductor material between the first sidewall spacer and the shallow trench isolation structure;
forming an oxide mask layer over the gate electrode structure, the first sidewall spacer, the self-aligned dummy structure, and the first surface of the shallow trench isolation structure;
etching the oxide mask layer to a depth of the self-aligned dummy structure to expose a dummy structure surface;
selectively removing the self-aligned dummy structure to expose a semiconductor surface in the region of the semiconductor material between the first sidewall spacer and the shallow trench isolation structure, wherein a portion of the oxide mask layer remains only disposed on the shallow trench isolation structure as an isolation structure mask after selectively removing the self-aligned dummy structure such that the oxide mask layer is formed in a self-aligned manner on the exposed first surface of the shallow trench isolation structure after epitaxially growing the crystalline material over the region of the semiconductor material between the first sidewall spacer and the shallow trench isolation structure;
etching a recess in the region of the semiconductor material disposed between the first sidewall spacer and the shallow trench isolation structure with the isolation structure mask in place; and
epitaxially growing a semiconductor material within the recess to form an epitaxially-grown semiconductor region adjacent to the gate electrode structure.

11. A method for fabricating an integrated circuit comprising:
providing a semiconductor substrate including a shallow trench isolation structure disposed therein and a gate electrode structure overlying semiconductor material of the semiconductor substrate;
forming a first sidewall spacer adjacent to the gate electrode structure, wherein a first surface of the shallow trench isolation structure is exposed and spaced from the first sidewall spacer by a region of the semiconductor material;

epitaxially growing a crystalline material over the region of the semiconductor material between the first sidewall spacer and the shallow trench isolation structure to form a self-aligned dummy structure, wherein the dummy structure is not embedded in the region of semiconductor material, and wherein the shallow trench isolation structure remains free of the dummy material after epitaxially growing the crystalline material over the region of the semiconductor material between the first sidewall spacer and the shallow trench isolation structure, forming an oxide mask layer in a self-aligned manner on the exposed first surface of the shallow trench isolation structure after epitaxially growing the crystalline material over the region of the semiconductor material between the first sidewall spacer and the shallow trench isolation structure, wherein the region of the semiconductor material disposed between the first sidewall spacer and the shallow trench isolation structure is free from the isolation structure mask, and wherein the isolation structure mask is only disposed on the shallow trench isolation structure;

etching a recess in the region of the semiconductor material disposed between the first sidewall spacer and the shallow trench isolation structure with the isolation structure mask in place;

epitaxially growing a semiconductor material within the recess after masking the first surface of the shallow trench isolation structure with the isolation structure mask to form an epitaxially-grown semiconductor region adjacent to the gate electrode structure;

forming source/drain regions in the epitaxially-grown semiconductor region; and forming an interlayer dielectric layer overlying the gate electrode structure, the first sidewall spacer, the isolation structure mask; and the source/drain regions.

* * * * *